United States Patent [19]

Podell et al.

[11] Patent Number: 5,280,412
[45] Date of Patent: Jan. 18, 1994

[54] THERMAL/ELECTRICAL FEEDTHROUGH SEAL

[75] Inventors: Allen F. Podell, Palo Alto; Todd G. Brehmer, San Jose, both of Calif.

[73] Assignee: Pacific Monolithics, Sunnyvale, Calif.

[21] Appl. No.: 44,238

[22] Filed: Apr. 6, 1993

[51] Int. Cl.$^5$ ............................................. H05K 7/20
[52] U.S. Cl. ................................... 361/710; 174/16.3; 174/50.53; 174/35 R; 361/816
[58] Field of Search ................ 174/16.3, 50.52, 50.53, 174/56.55, 35R, 35C; 361/383, 386–389, 394, 395, 399, 424; 165/80.3, 185

[56] References Cited

U.S. PATENT DOCUMENTS

| | | |
|---|---|---|
| 3,205,409 | 9/1965 | Owerko . |
| 3,757,272 | 9/1973 | Laramee et al. . |
| 3,908,188 | 9/1975 | Kawamoto ...................... 361/389 |
| 4,167,031 | 9/1979 | Patel ................................ 361/386 |
| 4,483,632 | 11/1984 | Dewey et al. ................... 361/389 |
| 4,621,304 | 11/1986 | Oogaki et al. . |
| 5,065,282 | 11/1991 | Polonio . |
| 5,086,509 | 2/1992 | Inubushi et al. . |
| 5,124,883 | 6/1992 | Bakker . |

*Primary Examiner*—Gregory D. Thompson
*Attorney, Agent, or Firm*—Edward B. Anderson

[57] ABSTRACT

A microwave circuit has an electrical prong for external circuit connection, a ground and a dipole antenna. A circuit board supports the microwave circuit. A heat sink is mounted on the circuit board and has high thermal and electrical conductivity for conducting heat from the electrical circuit and conducting electricity relative to the circuit ground. The heat sink includes a cylindrical boss extending away from the circuit board and having a reduced diameter upper rim and a threaded internal bore having a partially closed bottom. The circuit prong extends into the bore through the bore bottom and is electrically isolated from the heat sink. A cover encloses the circuit, circuit board and heat sink. It has low electrical and thermal conductivity and has an opening into which the reduced diameter upper rim of the heat sink boss extends. An outer sleeve is sized to receive the cover and has high thermal and electrical conductivity and an opening. A coaxial connector has a cylindrical sleeve with a threaded outer surface and an internal conductor extending axially through the connector sleeve. The connector sleeve is received in the outer sleeve opening and threadedly received in the heat sink boss bore for securing by use of a locknut on the connector sleeve, the heat sink relative to the cover and thermally and electrically coupling the heat sink to the outer sleeve. The internal conductor is in electrical contact with the circuit prong. A first seal is positioned between the bottom of the heat sink bore and the connector received in the bore. A second seal is positioned between the heat sink boss and the cover adjacent to the cover opening.

12 Claims, 3 Drawing Sheets

THERMAL/ELECTRICAL FEEDTHROUGH SEAL

BACKGROUND OF THE INVENTION

1. Field of the Invention

This invention relates to an assembly providing external electrical and thermal terminals for a circuit, and in particular to such an assembly that seals the circuit in a circuit cover.

2. Description of the Prior Art

It is known that covers for housing electrical circuits exist. The electrical terminals for connecting an enclosed circuit is usually through a hole in the housing wall. If the circuit needs to be weatherproof, a seal is applied at the hole to prevent moisture and dust from getting inside.

It is also known to use heat sinks to draw heat from a circuit component. The use of a heat sink to conduct heat to a shield case is also known, as is disclosed in U.S. Pat. No. 4,621,304 issued to Oogaki et al. It is also known to secure a combination circuit ground/heat sink to a circuit board by an electrical connector assembly as is disclosed in U.S. Pat. No. 5,124,883 issued to Bakker. U.S. Pat. No. 5,065,282 issued to Polonio discloses a mechanical fastener, in the form of a screw, that secures an electronic circuit component housing to a circuit board. The screw functions as both a heat sink and an electrical connection between the component and the circuit on the circuit board. Individual signals are connected to the circuit board through separate conductors. Inubushi et al. disclose in U.S. Pat. No. 5,086,509 a wireless telephone cover that serves as a heat sink. Owerko discloses in U.S. Pat. No. 3,205,409 a carrying case containing an electronic circuit in which a closure also functions as a mechanical push button.

In environments that are subject to adverse ambient moisture or other atmospheric conditions, it is desirable to provide an enclosure, for a circuit with external electrical terminals, with as few openings as possible. There thus remains a need for an assembly that provides a plurality of functions relating to securing the enclosure, securing the circuit relative to the enclosure, and transmitting thermal and electrical energy through the enclosure wall.

SUMMARY OF THE INVENTION

These features are provided in the present invention by an assembly having a plurality of functions. In one aspect of the invention, the assembly comprises an electrical circuit, a circuit board for supporting the electrical circuit, and a heat sink mounted on the circuit board having high thermal conductivity for conducting heat from the electrical circuit. An outer element spaced from the circuit board has high thermal conductivity and also has an opening. A coupler extends through the opening in the outer element for securing the heat sink relative to the outer element. The coupler has a sleeve thermally coupling the heat sink and the outer element, and an electrical conductor in electrical contact with the electrical circuit and extending into the opening in the outer element for connection with an external circuit.

In another aspect of the invention, the assembly includes the circuit, circuit board and coupler. It also includes a circuit cover having low electrical conductivity and having an opening. The coupler extends through the opening in the cover for securing the circuit board relative to the cover. The coupler also includes the electrical conductor that is in electrical contact with the electrical circuit and extends through the opening in the cover.

In yet another aspect of the invention, the assembly includes the circuit, circuit board, heat sink, cover and outer element. The coupler extends through the openings in the cover and outer element, for securing the heat sink relative to the cover and thermally coupling the heat sink and the outer element.

These features are provided in the preferred embodiment of the invention by a microwave antenna assembly comprising a microwave circuit having an electrical prong for external circuit connection, a ground and a dipole antenna. A circuit board supports the microwave circuit. A heat sink is mounted on the circuit board and has high thermal and electrical conductivity for conducting heat from the electrical circuit and conducting electricity relative to the circuit ground. The heat sink includes a cylindrical boss extending away from the circuit board and having a reduced diameter upper rim and a threaded internal bore having a partially closed bottom. The circuit prong extends into the bore through the bore bottom and is electrically isolated from the heat sink.

A cover encloses the circuit, circuit board and heat sink. It has low electrical and thermal conductivity and has an opening into which the reduced diameter upper rim of the heat sink boss extends. An outer sleeve is sized to receive the cover and has high thermal and electrical conductivity and an opening sized to freely receive a coaxial F-connector. The coaxial connector has a cylindrical sleeve with a threaded outer surface and an internal conductor extending axially through the sleeve. The connector sleeve is threadedly received in the heat sink boss bore. A locknut threaded on the connector secures the heat sink relative to the cover and sleeve and thermally and electrically couples the heat sink to the outer sleeve by compressing the outer sleeve against the top of the heat sink boss. The internal conductor is in electrical contact with the circuit prong. A first seal is positioned between the bottom of the heat sink bore and the connector received in the bore. A second seal is positioned between the heat sink boss and the cover adjacent to the cover opening.

An assembly made according to the invention provides various functions with a single coupler. The internal electrical circuit is secured relative to the cover and sealed from the external environment. Thermal energy is transmitted from within the enclosure to the external sleeve, and electrical energy is conducted through the cover.

These and other features and advantages of the present invention will be apparent from the following detailed description of the preferred embodiment of the invention, described for purposes of illustration but not limitation, and as illustrated in the accompanying drawings.

DETAILED DESCRIPTION OF THE PREFERRED EMBODIMENT

Figure 1:
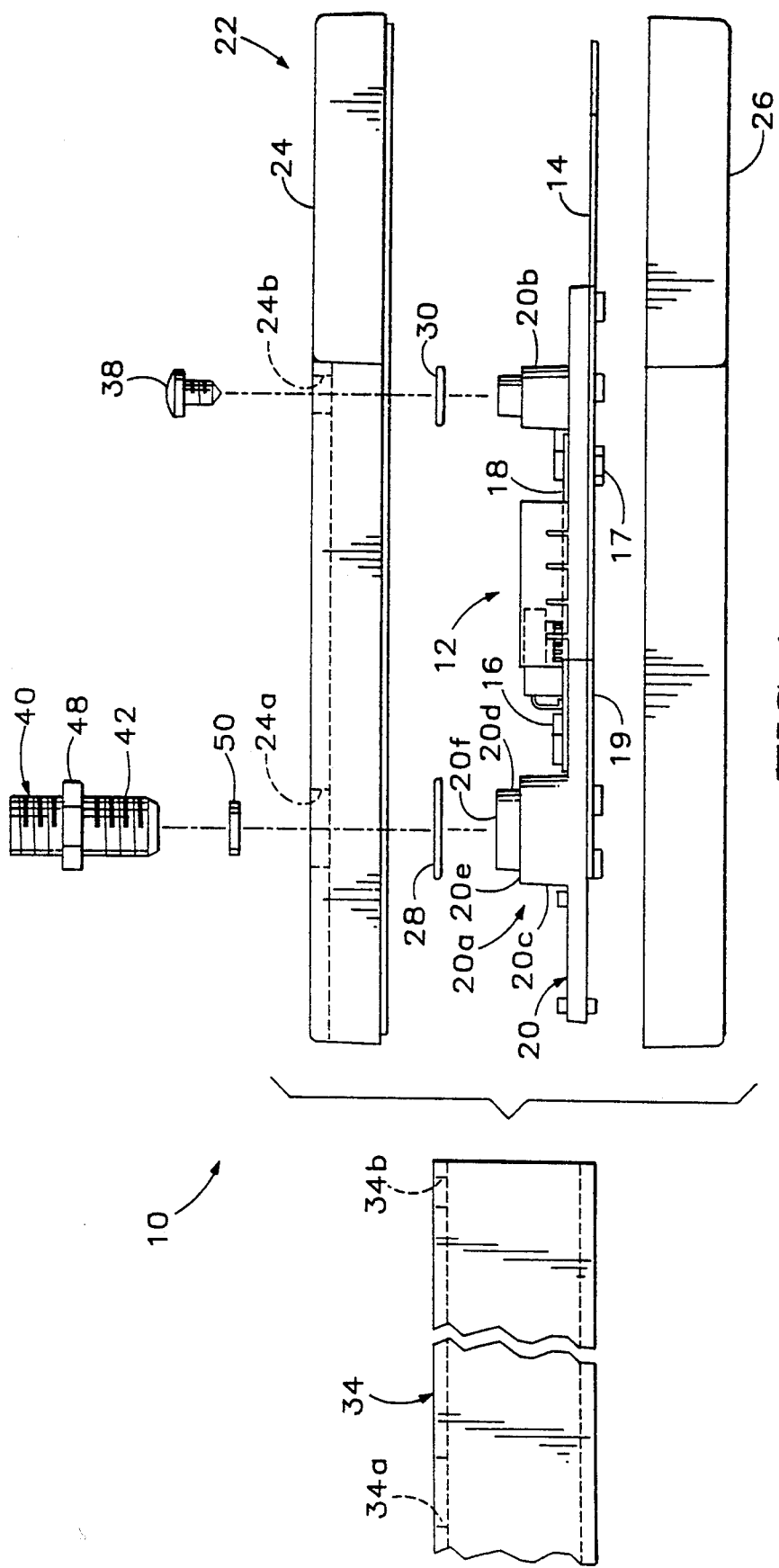
FIG. 1 is an exploded side view of an electrical circuit assembly made according to the invention.

Referring to the figures, a microwave antenna circuit assembly made according to the invention is shown generally at 10. Assembly 10 includes a microwave circuit, shown generally at 12, having a dipole antenna 14 and various components, shown generally at 16 and 17, making up associated circuitry, such as an up/down converter. The thermal and electrical conductivities of various components of assembly 10 are important. Thus, a component that is made of a material that is referred to as being conductive of energy is considered to have a relatively high conductance compared to another material that is considered to have relatively low conductance of that energy.

Circuit 12 is mounted on circuit boards 18 and 19 between which is attached a heat sink 20 having relatively high thermal conductance for drawing thermal energy from components 16 and 17. Heat sink 20 includes first and second upstanding bosses 20a and 20b. Boss 20a includes a generally cylindrical base section 20c and a reduced diameter upper section 20d, resulting in a circular shoulder 20e and a top edge 20f. As shown particularly in FIG. 3, extending into boss 20a is a threaded bore 20g having a partially closed bottom 20h. Bottom 20h has an opening 20i upwardly through which an electrically conductive prong 21 extends. Prong 21 is electrically connected to circuit 12 for conducting a microwave signal. Heat sink 20 is also made of electrically-conductive metal and is connected to the ground potential of circuit 12. Boss 20b is structured similar to boss 20a except that the bottom of the bore is closed and overall it has smaller dimensions.

A plastic enclosure or cover 22 has low thermal and electrical conductance, is formed of upper and lower sections 24 and 26, respectively, and completely encloses circuit 12, circuit boards 18 and 19 and heat sink 20. The upper and lower sections are formed to be hermetically sealed together. Upper cover section 24 has openings 24a and 24b sized to receive the upper sections of the heat sink bosses, such as section 20d received in opening 24a, shown in FIG. 3. An O-ring seal seats on each boss shoulder, including seal 28 associated with boss 20a and seal 30 associated with boss 20b. The inner surface of upper cover section 24 seats against the seal, weatherproofing the interior cavity 32 formed by cover 22.

Figure 3:
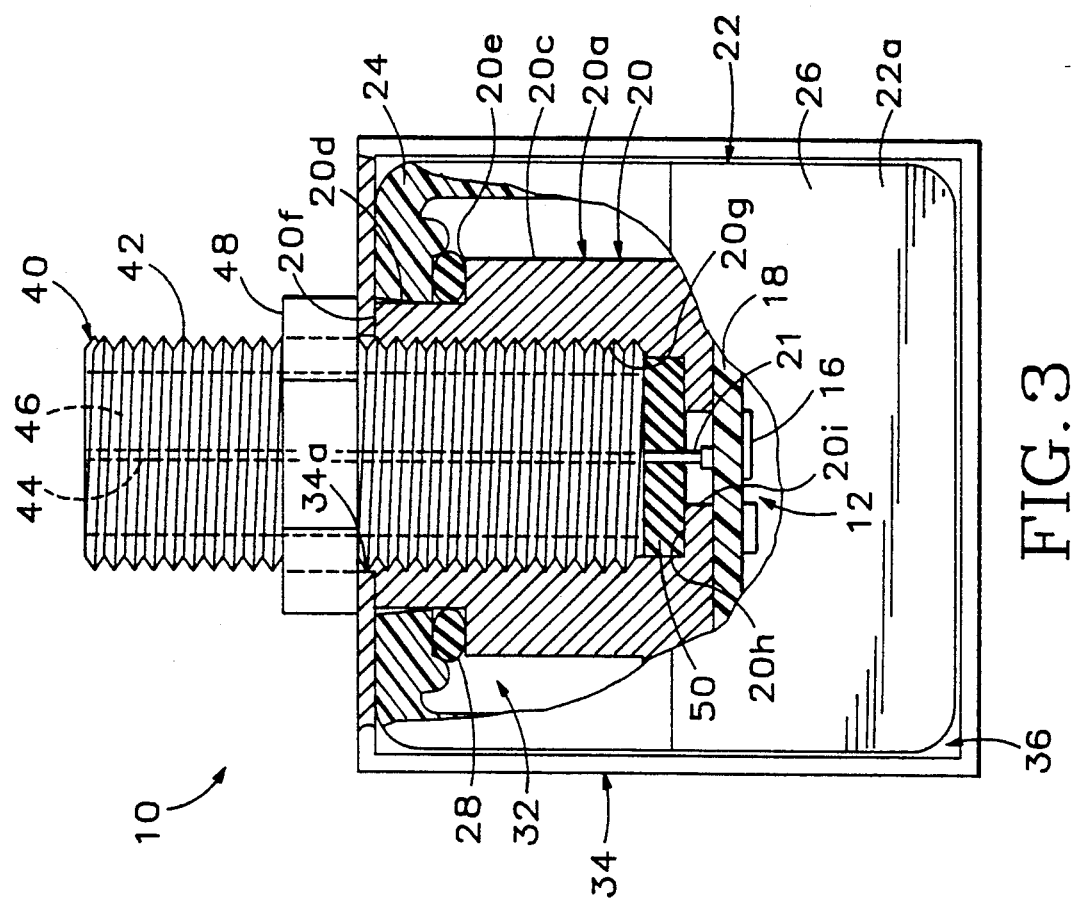
FIG. 3 is a cross section taken along line 3—3 in FIG. 2.

When cover sections 24 and 26 are sealed together, a handle section 22a and a dipole section 22b are formed. Handle section 22a has a nearly square cross section, as shown in FIG. 3. A metal sleeve 34, also referred to as an outer element, has an interior channel 36 that is sized so that handle section 22a is slidingly received in it. Sleeve 34 has openings 34a and 34b aligned with openings 24a and 24b, respectively, as shown in phantom lines in FIG. 1.

The assembly is secured together by a conventional coaxial microwave F-connector 40, also referred to herein as a coupler. F-connector 40 includes an outer, thermally and electrically conductive cylindrical threaded sleeve 42, and an internal, coaxial electrical conductor 44, electrically insulated from sleeve 42 by insulation 46. The F-connector extends through opening 34a and bore 20g, and is threadedly received in bore 20g so that conductor 44 is in contact with prong 21. A locknut 48, also referred to as a fastener, threaded on connector 40, secures the top edge 20f of boss 20a against sleeve 34 and holds cover 22 sandwiched between the top edge of the boss and sleeve 34.

A sealing gasket 50 is positioned on the bottom of bore 20g to seal sleeve 42 relative to opening 20i. Gasket 50 has a bore, not shown, accommodating the extension of prong 21 into bore 20g.

Figure 2:
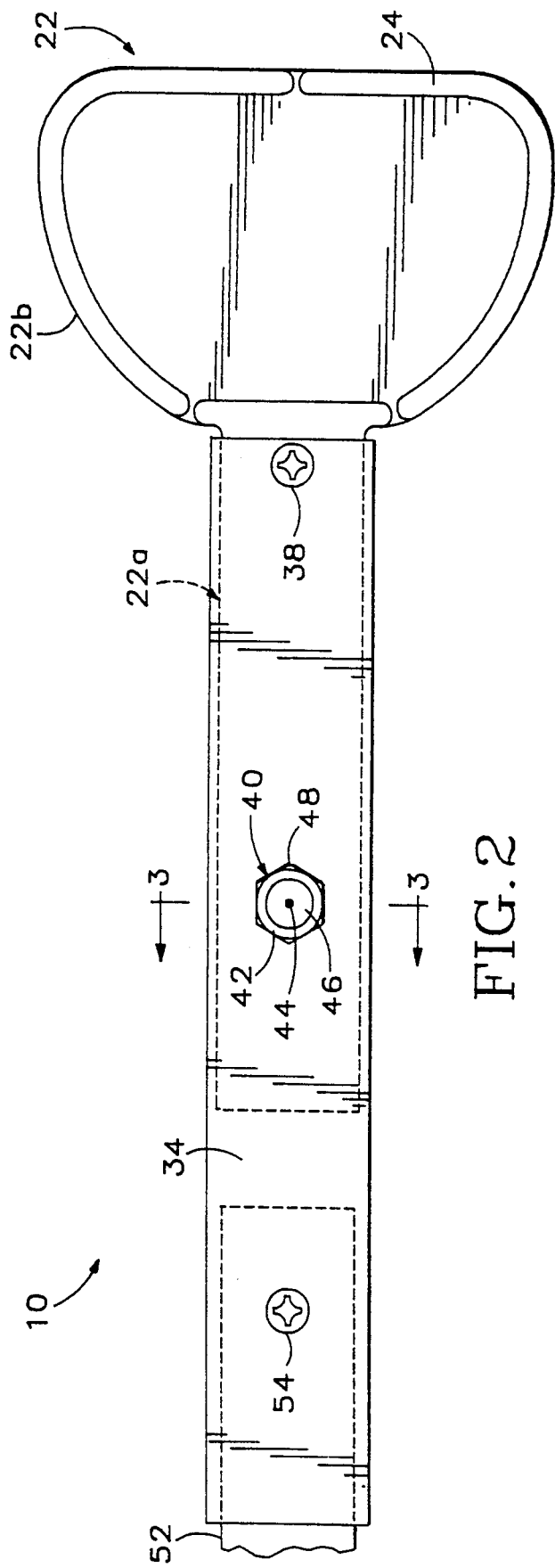
FIG. 2 is a top view of the assembled assembly of FIG. 1.

As shown in FIG. 2, sleeve 34 extends beyond the end of handle section 22a. A support rod 52 may be inserted in the open end of the channel in sleeve 34, and be secured appropriately, such as by a screw 54 passing through an opening in the sleeve, similar to the function of screw 38. Any support configuration appropriate for the installation may be used.

Since the heat sink is secured to circuit boards 18 and 19, the F-connector, in combination with screw 38, secures the entire assembly together. Further, the F-connector functions to conduct thermal energy from heat sink 20 to sleeve 34, both directly through it and through locknut 48, as well as by holding the sleeve against the top edge of the heat sink. Finally, the F-connector transmits electrical energy, both to sleeve 34 through sleeve 42 which is connected to circuit ground, as well as via inner coaxial conductor 44. A conventional external male connector (not shown) is simply connected to the end of the F-connector extending beyond sleeve 42. Finally, the connector assembly seals the interior of cover 22, making it weatherproof. Thus, a simple electrical circuit assembly is provided by the invention that serves many functions, thereby reducing cost to manufacture and assemble, and improving reliability during use.

It will be apparent to one skilled in the art that variations in form and detail may be made in the preferred embodiment without varying from the spirit and scope of the invention as defined in the claims and any modification of the claim meaning as provided under the doctrine of equivalents. For instance, the configuration of the heat sink, circuit board, cover, seals, connector, and sleeve may all be varied widely. The preferred embodiment is thus provided for purposes of explanation and illustration, but not limitation.

We claim:

1. An electrical circuit assembly comprising:
  an electrical circuit;
  a circuit board for supporting the electrical circuit;
  a heat sink mounted on the circuit board having high thermal conductivity for conducting heat from the electrical circuit;
  an outer element having high thermal conductivity and also having an opening; and
  a coupler extending through the opening in the outer element for securing the heat sink relative to the outer element, the coupler having a sleeve thermally coupling the heat sink and the outer element, and including an electrical conductor extending in electrical contact with the electrical circuit and extending into the opening in the outer element for connection with an external circuit.

2. An assembly according to claim 1 wherein the coupler is threadedly received in the heat sink and the heat sink and outer element are in thermal contact.

3. An assembly according to claim 2 further comprising a fastener having high thermal conductivity mounted on the coupler for securing the outer element against the heat sink.

4. An assembly according to claim 2 wherein the heat sink includes a boss extending from the circuit board toward the opening in the outer element, the boss having a threaded bore, with at least a partially closed bottom, for receiving the coupler, the assembly further comprising means for sealing the coupler relative to the bottom of the bore.

5. An assembly according to claim 1 wherein the heat sink also has high electrical conductivity and is connected electrically to the electric circuit isolated from the electric terminal, and the sleeve of the coupler also has high electrical conductivity, is electrically isolated from the electrical conductor, and is in physical contact with the heat sink.

6. An assembly according to claim 1 further comprising a cover having an opening and having low electrical and thermal conductivity, for enclosing the circuit, the coupler further extending through the opening in the cover and securing the circuit relative to the cover.

7. An electrical circuit assembly comprising:
an electrical circuit;
a circuit board for supporting the electrical circuit;
a heat sink mounted on the circuit board having high thermal conductivity for conducting heat from the electrical circuit;
a cover having low electrical and thermal conductivity and having an opening, for enclosing the circuit;
an outer element having high thermal conductivity and also having an opening; and
a coupler extending through the openings in the cover and outer element, for securing the heat sink relative to the cover and thermally coupling the heat sink and the outer element.

8. An assembly according to claim 7 wherein the coupler extends externally of the cover and through the opening in the outer element, and the heat sink extends through the opening in the cover but not through the opening in the outer element.

9. An assembly according to claim 7 wherein the heat sink has a shoulder adjacent to and extending around the opening in the cover, the assembly further comprising means supported on the shoulder for sealing the cover relative to the heat sink around the opening in the cover.

10. An assembly according to claim 7 further comprising means for sealing the cover relative to the heat sink around the opening in the cover.

11. An assembly according to claim 10 wherein the heat sink has a shoulder adjacent to and extending around the opening in the cover, the assembly further comprising means supported on the shoulder for sealing the cover relative to the heat sink around the opening in the cover.

12. A microwave antenna assembly comprising:
a microwave circuit having an electrical prong for connection with an external circuit, a ground and a dipole antenna;
a circuit board for supporting the microwave circuit;
a heat sink mounted on the circuit board having high thermal and electrical conductivity for conducting heat from the electrical circuit and being connected to the circuit ground, the heat sink including a cylindrical boss extending away from the circuit board and having a reduced diameter upper rim and a threaded internal bore having a partially closed bottom, the circuit prong extending into the bore through the bore bottom and being electrically isolated from the heat sink;
a cover having low electrical and thermal conductivity and having an opening into which the reduced diameter upper rim of the heat sink boss extends, for enclosing the circuit, circuit board and heat sink;
an outer sleeve sized to receive the cover and having high thermal and electrical conductivity and an opening;
a coaxial connector having a cylindrical connector sleeve with a threaded outer surface and an internal conductor electrically insulated from the connector sleeve extending axially through the connector sleeve, the connector sleeve being received in the outer sleeve opening and threadedly received in the heat sink boss bore, for securing the heat sink relative to the cover and thermally and electrically coupling the heat sink to the outer sleeve, the internal conductor being in electrical contact with the circuit prong;
first sealing means between the bottom of the heat sink bore and the connector received in the bore; and
second sealing means between the heat sink boss and the cover adjacent to the cover opening.

* * * * *